(12) United States Patent
Heuermann et al.

(10) Patent No.: US 9,155,164 B2
(45) Date of Patent: Oct. 6, 2015

(54) HF SYSTEM FOR HIGH-FREQUENCY LAMP

(71) Applicant: Dritte Patentportfolio Beteiligungsgesellschaft MBH & Co. KG, Schoenefeld (DE)

(72) Inventors: Holger Heuermann, Aachen (DE); Arash Sadeghfam, Aachen (DE)

( * ) Notice: Subject to any disclaimer, the term of this patent is extended or adjusted under 35 U.S.C. 154(b) by 0 days.

(21) Appl. No.: 14/360,189

(22) PCT Filed: Nov. 22, 2012

(86) PCT No.: PCT/EP2012/073292
§ 371 (c)(1),
(2) Date: May 22, 2014

(87) PCT Pub. No.: WO2013/076174
PCT Pub. Date: May 30, 2013

(65) Prior Publication Data
US 2015/0115842 A1    Apr. 30, 2015

(30) Foreign Application Priority Data
Nov. 23, 2011  (DE) .......................... 10 2011 055 624

(51) Int. Cl.
*H05B 37/02*  (2006.01)
*H03L 7/00*  (2006.01)

(52) U.S. Cl.
CPC . *H05B 37/02* (2013.01); *H03L 7/00* (2013.01)

(58) Field of Classification Search
CPC ................................ H05B 37/02; H03L 7/00
USPC ......................................... 315/291, 307–309
See application file for complete search history.

(56) References Cited

U.S. PATENT DOCUMENTS

| | | | |
|---|---|---|---|
| 2002/0079845 A1 | 6/2002 | Kirkpatrick | |
| 2010/0231236 A1* | 9/2010 | Harrison | 324/645 |
| 2010/0253231 A1 | 10/2010 | Devincentis | |
| 2010/0283389 A1 | 11/2010 | Frederick | |
| 2013/0049854 A1* | 2/2013 | Shafer | 330/2 |
| 2014/0049158 A1* | 2/2014 | Chen et al. | 315/5.41 |

OTHER PUBLICATIONS

International Search Report dated Feb. 7, 2013, for International Application No. PCT/EP2012/073292.
International Preliminary Report on Patentability dated May 27, 2014, for International Application No. PCT/EP2012/073292.

* cited by examiner

*Primary Examiner* — Don Le
(74) *Attorney, Agent, or Firm* — Cook Alex Ltd.

(57) ABSTRACT

The invention relates to an HF system that comprises an HF device (5), particularly an HF lamp, as well an HF spark-plug or similar HF plasma application, and an HF signal-incoupling device (3) for operating said HF device (5). The HF system comprises an oscillator (7) for generating an HF signal to operate said HF device (5), and said system is characterised in that it comprises means (15) for generating a voltage signal ($U_{prop}$) that is proportional to the degree of adaptation of the HF device, on the basis of the HF signal generated by the oscillator (7) and a signal reflected by said HF device. Moreover, the system is characterised in that it comprises a device (27), preferably without a microprocessor, for generating a control signal ($U_A$) for adapting the oscillator (7) output-frequency on the basis of the voltage signal ($U_{prop}$) which is proportional to the degree of adaptation of the HF device (5).

21 Claims, 4 Drawing Sheets

| K1 | K2 | K3 | Y |
|----|----|----|---|
| 0  | 0  | 0  | 0 |
| 0  | 0  | 1  | 0 |
| 0  | 1  | 0  | 0 |
| 0  | 1  | 1  | 0 |
| 1  | 0  | 0  | 1 |
| 1  | 0  | 1  | 0 |
| 1  | 1  | 0  | 0 |
| 1  | 1  | 1  | 1 |

HF SYSTEM FOR HIGH-FREQUENCY LAMP

The invention relates to an RF system according to the preamble of claim 1, a signal coupling-in apparatus according to the preamble of claim 14, and a method for operating an RF device according to the preamble of claim 15.

Figure 1A:
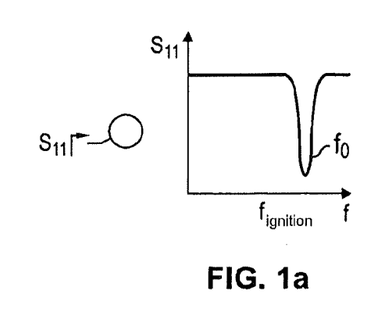
FIG. 1a shows a schematic graph of the operating frequency before ignition of the RF device.
Figure 1B:
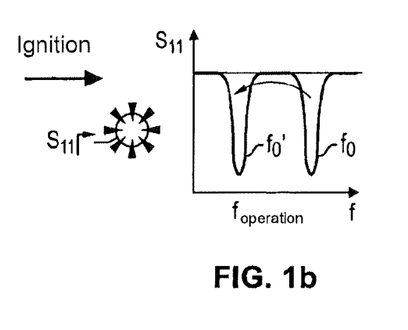
FIG. 1b shows a schematic graph of the operating frequency after ignition of the RF device.

An RF system of the type discussed here is known from WO 2009/068618 A2, for example. It serves, in particular, for efficiently operating radio-frequency devices such as radio-frequency lamps at high frequencies, in particular in the ISM band at 2.45 GHz. The operation of RF devices, in particular RF lamps, RF spark plugs or similar RF plasma applications, presupposes good radio-frequency matching of the lamp. The matching of the lamp is frequency-dependent and a measure of what portion of the RF signal generated by an oscillator can be taken up by the lamp for the operation thereof. The greater the matching of the RF device to the frequency of an RF signal fed in, the smaller therefore the portion of a signal reflected by the lamp. The matching of the RF device thus makes a significant contribution to the total efficiency of the RF system. Particularly in the case of radio-frequency-operated energy saving lamps, the deviation of the operating frequency from the optimum matched frequency in an RF system of the order of magnitude of a few 10 MHz can lead to a reduction of the efficiency of more than 50%. The matching of the RF device to an RF signal fed in is dependent on a number of factors. These concern, in particular, manufacturing tolerances, the thermal behaviour and ageing-dictated changes in the electronics of the RF device. Furthermore, the position and generally also the magnitude of the matching change after the ignition of the RF device, as becomes clear from FIG. 1. FIG. 1a shows a schematic illustration of the operating frequency $f_0$ of the RF signal fed to the RF device before ignition and Figure 1b shows the same signal after ignition of the RF device. It becomes clear that the operating frequency $f_0'$ is shifted after ignition of the RF device, such that it no longer corresponds to the optimum operating frequency of the RF device. In this case, the matching of the RF device is no longer optimal and reflections of an RF signal fed to the RF device occur, which, as mentioned, can considerably reduce the efficiency of the RF device.

The prior art discloses control circuits provided for dynamic closed-loop control of a matching of an RF device. Said circuits use variable capacitors known from the field of amplifier development and MHz plasma technology, for example. In this case, variable capacitors linked to stepper motors are used in order to obtain an impedance transformation. This solution enables an analog matching of the RF device, but necessarily provides the use of a microcontroller that controls the closed-loop control and forms the individual settings. As a result, firstly the dynamic matching time is lengthened and the circuit furthermore becomes relatively complex and cost intensive Furthermore, it is known to provide switching networks at higher frequencies, for example in the mobile radio field, which networks, by virtue of different inductive and capacitive elements being switched on and off, enable matching mechanisms having discrete states for dynamically matching an antenna. This solution makes it possible to realize discrete matching values for a large variation of load impedances. The discrete steps and compensatable load deviations that can be realized are dependent on the number of switching states and the elements of the matching mechanisms. This solution also necessarily provides the use of a microcontroller, which once again makes the entire system complex and relatively expensive.

Therefore, it is an object of the present invention to provide an RF system comprising an RF device and an RF signal coupling-in apparatus which realizes the matching of the RF device to an optimum operating frequency simply, cost-effectively and efficiently.

An RF system comprising the features of claim 1 is proposed for achieving the object mentioned above. The RF system according to the invention comprises an RF device, in particular an RF lamp, an RF spark plug or similar RF plasma application, and an RF signal coupling-in apparatus for operating the RF device, wherein the RF signal coupling-in apparatus comprises an oscillator for generating an RF signal for operating the RF device. The RF system is distinguished by means for generating a voltage signal proportional to the degree of matching of the RF device on the basis of the RF signal generated by the oscillator and a signal reflected by the RF device, and by a preferably microprocessorless device for generating a control signal for matching the output frequency of the oscillator on the basis of the voltage signal proportional to the degree of matching of the RF device.

Therefore, an essential point of the present invention is that an optimum matching of the RF device is ensured at the ignition time and during operation, this being brought about by a control circuit that dynamically controls the frequency of the control signal to the frequency of the optimum matching of the RF device. Such a control circuit can be designated as an ALL circuit (Amplitude Locked Loop circuit). The RF system according to the invention and, in particular, the RF signal coupling-in apparatus according to the invention thus enable an analog and dynamic closed-loop control of the frequency position of an RF signal to the matching of an RF device, in particular of an energy saving lamp, both at the ignition time and during the operation of the energy saving lamp. In contrast to the previously known solutions in the prior art, the present invention preferably does not require a microcontroller, but rather only a few logic gates that form a logic unit required for controlling the circuit elements. The entire RF system is thereby greatly simplified and can be realized as necessary on an individual semiconductor IC.

The essential basic concept of the present invention is that a voltage signal proportional to the degree of matching of the RF device is generated, and corresponding means for this purpose are provided, wherein the voltage signal proportional to the degree of matching of the RF device is generated on the basis of the RF signal generated by the oscillator and a signal reflected by the RF device. The voltage signal proportional to the degree of matching of the RF device is then processed further in a preferably microprocessorless device, in particular using at least one logic gate, in such a way that it is possible to output a control signal for matching the output frequency of the oscillator within an extremely short time.

An analog closed-loop control of the operating frequency to the frequency with the best matching of the RF device is effected by means of the RF system according to the invention. In this case, it is ensured that the RF plasma is reliably ignited at an optimum frequency. It is additionally ensured that the lamp is operated at an optimum frequency. Furthermore, it is ensured that deviations between the operating frequency and the optimum frequency, which are attributable for example to manufacturing tolerances, thermal behaviour or ageing-dictated changes in the electronics, are taken into account during ignition and during operation. By virtue of a microcontroller being dispensed with, a preferred RF system according to the present invention achieves a faster closed-loop control of the operating frequency since the control time is now substantially only a function of gate transit times. Furthermore, the entire circuit arrangement of the RF signal coupling-in apparatus becomes more compact since only individual logic gates are required. The circuit arrangement can also be realized, if appropriate, on an individual semiconductor IC. A compact and expedient solution approach for mass production arises with a semiconductor IC. A further advantage afforded by the present invention is the significantly less complex development since the hardware is leaner and no software is required. The fact that no software is required means, moreover, that no software bugs can occur either, and so the RF system overall is less susceptible to disturbance.

Particular preference is given to an RF system in which the means for generating a voltage signal proportional to the degree of matching of the RF device comprise at least one coupling-out device for coupling out a portion of the RF signal generated by the oscillator and at least one further coupling-out device for coupling out a portion of the signal reflected by the RF device. Furthermore, preferably a voltage detection device for detecting and outputting a voltage signal of the coupled-out portion of the RF signal generated by the oscillator and at least one further voltage detection device for detecting and outputting a voltage signal of the coupled-out portion of the signal reflected by the RF device are provided. For generating the actual voltage signal proportional to the degree of matching of the RF device, provision is preferably made of a device, in particular at least one operational amplifier, which generates the voltage signal proportional to the degree of matching of the RF device on the basis of the voltage signal of the coupled-out portion of the signal reflected by the RF device and of the voltage signal of the coupled-out portion of the RF signal generated by the oscillator.

Alternatively, the means for generating a voltage signal proportional to the degree of matching of the RF device can comprise a circulator, which is designed for coupling out a portion of the RF signal generated by the oscillator and for coupling out a portion of the signal reflected by the RF device and, if appropriate, detects and outputs corresponding voltage signals of the coupled-out portions. Preferably, the circulator comprises at least one device, in particular at least one operational amplifier or at least one amplifier circuit, which generates a voltage signal proportional to the degree of matching of the RF device on the basis of the voltage signals of the coupled-out portions.

In a further preferred RF system, the preferably microprocessorless device for generating a control signal for matching the output frequency of the oscillator comprises a logic unit having at least one, preferably two logic gates which outputs a control signal for matching the input frequency of the oscillator on the basis of at least one, preferably three conditions. Furthermore, the logic unit can be connected to a shift register, wherein the shift register is provided for receiving an output signal of the logic unit. Furthermore, the preferably microprocessorless device can also comprise a clock generator device for clocking the output signal of the logic unit. In this way, an artificial digital signal can be generated or clocked. Preferably, the logic unit is connected to the oscillator via a loop filter for generating an analog output voltage, for controlling said oscillator. The analog output frequency is generated, in particular, by the digital output signal of the logic unit being smoothed by the loop filter. Alternatively, instead of the loop filter, a charge pump arrangement (charge pumps) can be provided for generating an analog output voltage, for controlling the frequency of the oscillator. As a further alternative, both the loop filter and the charge pump arrangement can be dispensed with and, instead, the preferably microprocessorless device, in particular the logic unit, is designed such that it is designed for generating an analog output voltage for controlling the frequency of the oscillator. Preferably, the RF system additionally comprises a reset circuit, which is designed to put the oscillator into a predefined state. Consequently, the reset circuit makes it possible to set a predefined state of the oscillator, in particular a predefined operating frequency.

A signal coupling apparatus for use in an RF system according to any of claims 1 to 13 is also proposed for achieving the object described above.

Finally, a method for operating an RF device, in particular an RF lamp, an RF spark plug or similar RF plasma application, is additionally proposed for achieving the object mentioned above. The method comprises the step of generating an RF signal for operating the RF device by means of an oscillator. The method is distinguished by generating a voltage signal proportional to the degree of matching of the RF device on the basis of the RF signal generated by the oscillator and of a signal reflected at the RF device. Furthermore, the method is distinguished by generating a control signal for matching the output frequency of the oscillator on the basis of the voltage signal proportional to the degree of matching of the RF device.

Preference is given to a method which involves generating a first condition on the basis of the voltage signal proportional to the degree of matching of the RF device before generating a control signal for matching the output frequency of the oscillator. Said first condition is preferably obtained by comparing the voltage signal proportional to the degree of matching of the RF device with a predefined voltage value. Preference is also given to generating a second condition on the basis of the voltage signal proportional to the degree of matching of the RF device before generating a control signal for matching the output frequency of the oscillator. In particular, in this case, the first condition is obtained by deriving the voltage signal proportional to the degree of matching of the RF device. The method according to the invention preferably also comprises the step of leading the first and the second condition and, in particular, also a third condition to one or more logic gates and generating a control signal for matching the output frequency of the oscillator on the basis of a truth table based on the logic gate or logic gates.

With regard to the advantages of the method according to the invention, reference is made to the advantages of the RF system according to the invention as explained above.

The invention is explained in greater detail below with reference to the drawing, in which.

Figure 2:
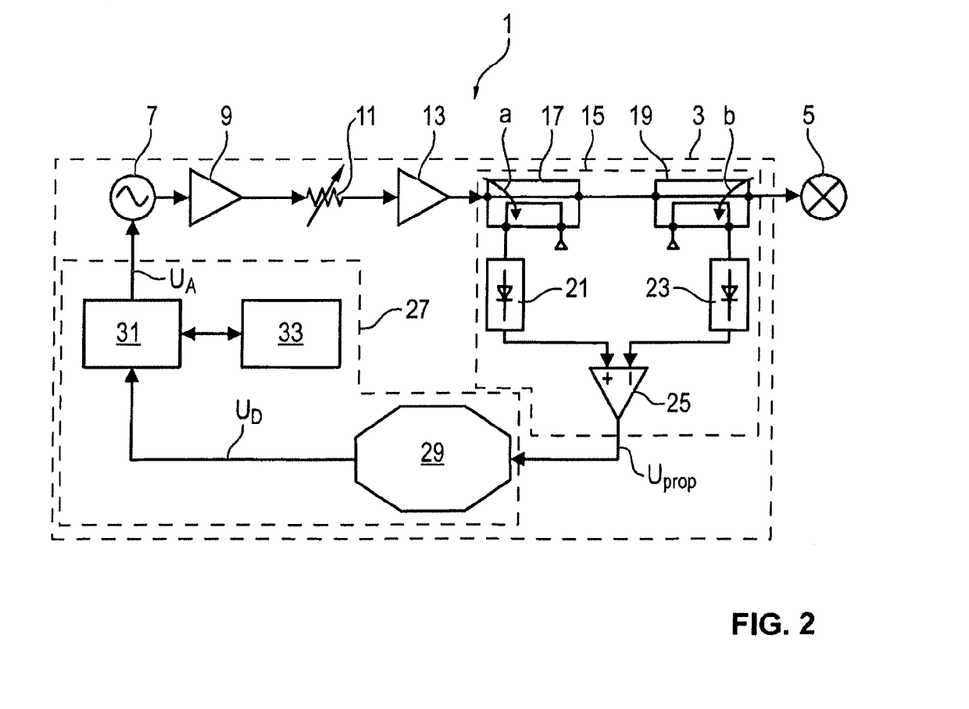
FIG. 2 shows a schematic circuit diagram of an exemplary embodiment of an RF system according to the invention.

FIG. 2 shows a schematic illustration of an embodiment of an RF system 1 according to the invention. The RF system 1 comprises an RF signal coupling-in apparatus 3 and an RF device 5, which can be an RF lamp, an RF spark plug or similar RF plasma application. The invention is described hereinafter purely by way of example on the basis of an RF lamp using the reference sign 5.

The RF signal coupling-in apparatus 3 serves for operating the RF lamp 5 and for this purpose generates an RF signal having an operating frequency for the ignition and the operation of the RF lamp 5 by means of an oscillator 7. In the case of the embodiment of the RF system 1 according to the invention as shown in FIG. 2, an amplifier 9 and a damping element 11 are connected to the oscillator 7, by means of which the output signal of the oscillator 7 can be increased or reduced before it is increased to the operating power by means of a further amplifier 13. The amplifiers 9 and 13 and the damping element 11 are optional and can either be omitted or be replaced by other suitable elements. The arrangement in other combinations between the RF lamp 5 and the oscillator 7 is also conceivable.

The RF signal coupling-in apparatus 3 additionally comprises means for generating a voltage signal proportional to the degree of matching of the RF device, said means being summarised with the reference sign 15. In accordance with the embodiment of the invention as illustrated in FIG. 2, said means 15 comprise two coupling-out devices 17 and 19, wherein the coupling-out device 17 serves for coupling out a portion a of the RF signal generated by the oscillator 7, while the coupling-out device 19 serves for coupling out a portion b of the signal reflected by the RF lamp 5. It goes without saying that a signal b is reflected by the RF lamp 5 only when the lamp is not optimally matched to the frequency of the RF signal generated by the oscillator 7. The coupling-out device 17 therefore serves for coupling out power running towards an RF lamp 5, while the coupling-out device 19 serves for coupling out a power running away from, i.e. reflected by the RF lamp 5.

The means bearing the reference numeral 15 furthermore comprise a voltage detection device 21 (detector), which serves for detecting and outputting a voltage signal of the coupled-out portion a of the RF signal generated by the oscillator 13. Furthermore, a voltage detection device 23 (detector) is provided, which serves for detecting and outputting a voltage signal of the coupled-out portion of the signal b reflected by the RF lamp 5. In accordance with the present embodiment of the invention, the two voltage signals generated by the voltage detection devices 21 and 23 are fed to a common operational amplifier 25, which generates a voltage $U_{prop}$ proportional to the lamp matching on the basis of the output voltages of the voltage detection devices 21 and 23.

As an alternative to the embodiment of the means—identified by the reference number 15—for generating a voltage signal $U_{prop}$ proportional to the degree of matching of the RF lamp, a circulator can be used instead of the coupling-out devices 17 and 19, which circulator couples out the reflected signal of the RF lamp 5 from the connection between the RF lamp 5 and the oscillator 7 and makes it available as a controlled variable. However, the RF signal of the oscillator 7 is lost in the process. In this case, either the operational amplifier 25 can be dispensed with, or the latter can be replaced by an amplifier circuit. In a further embodiment of the means 15 for generating a voltage signal proportional to the degree of matching of the RF lamp, provision can also be made for providing only one coupling-out device 17 or 19, which can serve respectively for coupling out both the portion of the RF signal generated by the oscillator 7 and the RF signal portion reflected by the lamp 5.

All that is crucial is that a device is provided which generates a voltage signal proportional to the degree of matching of the RF device from the RF signal of the oscillator 7 and the signal reflected at the lamp 5. In other words, the generated voltage signal proportional to the degree of matching of the RF device is a measure of how much of the RF signal of the oscillator 7 that is passed to the RF lamp 5 is reflected at the RF lamp 5 and thus how high the mismatch of the RF lamp is.

In a subsequent step, according to the invention, the voltage $U_{prop}$ proportional to the lamp matching is fed to a preferably microprocessorless device 27 for generating a control signal for matching the output frequency of the oscillator 7. In the case of the embodiment shown in FIG. 2, the preferably microprocessorless device 27 comprises an amplitude discriminator 29, a loop filter 31 and a reset circuit 33. The amplitude discriminator 29 generates, on the basis of the voltage $U_{prop}$ proportional to the degree of matching of the RF lamp 5, a digital or clocked output voltage $U_D$, which is in turn fed to a filter device, in particular to the loop filter 31, which smooths the clocked signal $U_D$ in such a way that a substantially analog output signal $U_A$ is generated, which is fed to the oscillator 7 as a control voltage. The control voltage $U_A$ fed to the oscillator 7 is thus a measure of whether the frequency of the oscillator 7 is to be increased, decreased or remain the same.

Figure 3:
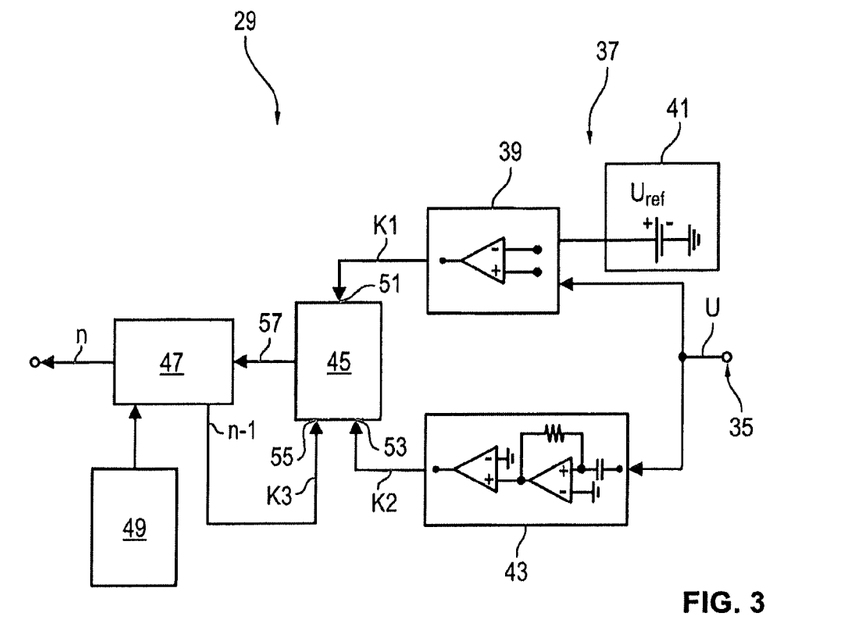
FIG. 3 shows a schematic circuit diagram of an exemplary embodiment of a preferably microprocessorless device for generating a control signal for matching the output frequency of the oscillator.

FIG. 3 shows an exemplary embodiment of the so-called amplitude discriminator 29 illustrated in FIG. 2. The amplitude discriminator 29 has an input 35, at which the voltage $U_{prop}$ proportional to the degree of matching of the RF lamp 5 is fed in. In the case of the present exemplary embodiment, a total of 3 conditions K1, K2 and K3 are generated in the amplitude discriminator 29. The first condition K1 is generated on the basis of the voltage signal $U_{prop}$ proportional to the degree of matching of the RF lamp 5 by means of said signal being compared with a predefined voltage value. For this purpose, the amplitude discriminator 29 comprises a comparator 39, to which first the voltage signal $U_{prop}$ and secondly a fixed voltage value are fed, the latter being generated by a voltage value generating device 41. The voltage value generating device 41 is preferably realized by a voltage divider. The comparator 39 compares the present value of the voltage $U_{prop}$ with the fixed voltage value of the voltage value generating device 41. The resulting output signal of the comparator 39 corresponds to the first condition K1.

At the same time, in the amplitude discriminator 29, the voltage signal $U_{prop}$ is fed to a differentiator unit 43 having an integrated inverted comparator, which unit derives the voltage signal $U_{prop}$. The output signal of the differentiator unit 43 thus provides information about the tendency of the lamp matching, that is to say whether the latter decreases or increases, and corresponds to the second condition K2.

The first condition K1 and the second condition K2 are fed to a logic unit 45. The logic unit 45 is connected to a shift register, in particular to a 2-bit shift register 47, which can be realized by two D-type flip-flops, for example, and receives from them a third condition K3. As illustrated in FIG. 3, the shift register 47 can be connected to a clock generator 49 in order to artificially digitize or clock the analog process within the amplitude discriminator 29.

Figure 4:
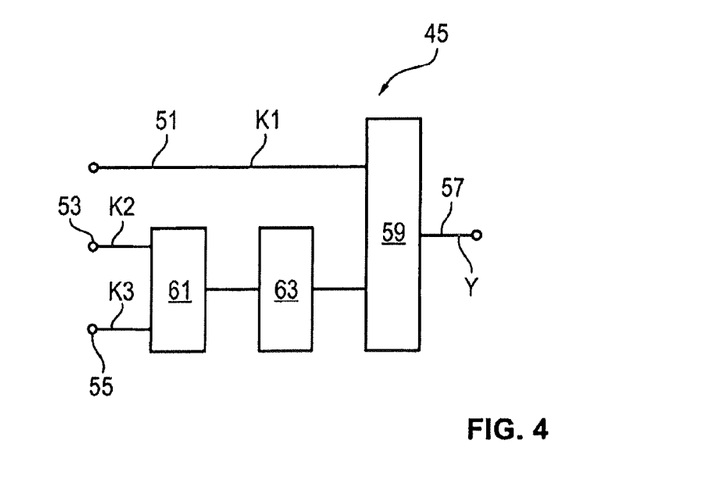
FIG. 4 shows a schematic illustration of an exemplary embodiment of a logic unit according to the invention.

A possible realization of the logic unit 45 of the amplitude discriminator 29 is illustrated in the schematic embodiment in accordance with FIG. 4. The logic unit 45 comprises three inputs 51, 53 and 55, wherein the first condition K1 is fed to the logic unit 45 by the input 51, the second condition K2 via the second input 53 and the third condition K3 via the third input 55. The logic unit 45 furthermore comprises an output 57 connected to the shift register 47 illustrated in FIG. 3.

In the exemplary embodiment in accordance with FIG. 4, the logic unit 45 comprises two logic gates 59 and 61 and an inverter 63. The logic gate 61 is an XOR gate, for example, while the logic gate 49 is an AND gate. The inverter 63 inverts the supplied signal of the XOR gate 61. If the output signal Y is present at the output 57 of the logic unit 45, the following holds true for the arrangement shown in FIG. 4:

$$Y = K1 \cdot \overline{(K2 \oplus K3)}$$

Figure 5:
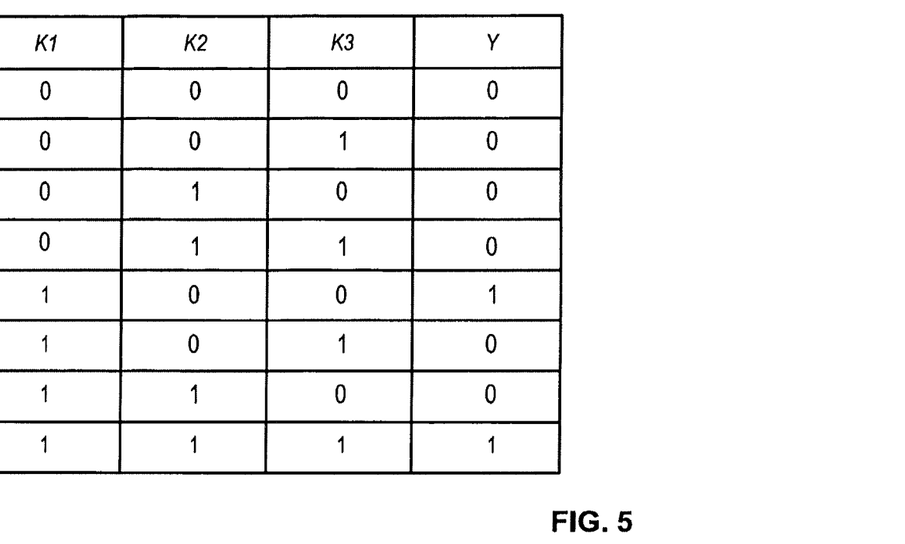
FIG. 5 shows a truth table realized by the logic unit.

The logic unit 45 having the abovementioned relationship can be assigned to the truth table shown in FIG. 5. It is evident from the truth table in accordance with FIG. 5 that, in this embodiment, the output frequency of the oscillator 7 is increased (Y=1) only when the voltage $U_{prop}$ proportional to the lamp matching from the operational amplifier 25 exceeds a value defined by the voltage value generating device 41 and at the same time the condition K2 generated by the differentiator unit 43 having an integrated inverting comparator is present (K2="1"), while the n−1 bit from the shift register 47 corresponds to a "1"

or the condition K2 generated by the differentiator unit 43 having an integrated inverted comparator is not present (K2="0"), while the N−1 bit from the shift register 47 corresponds to a "0".

Figure 6:
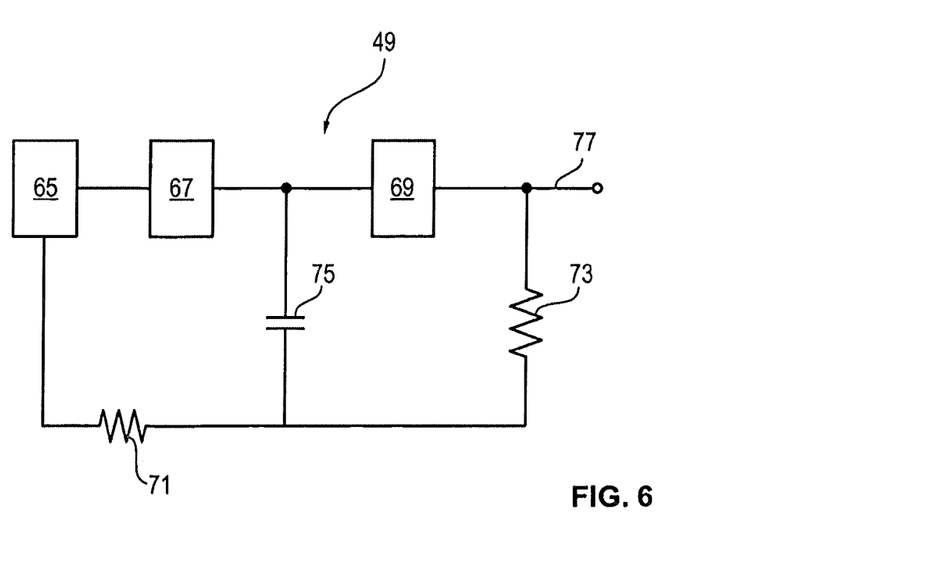
FIG. 6 shows a schematic illustration of an exemplary embodiment of a clock generator device.

The clock generator device 49 is advantageous because incorrect decisions on account of a transient response of the individual logic gates can be avoided thereby. A possible realization of the clock generator device 49 is illustrated in FIG. 6. Shown by way of example, the clock generator device 49 comprises there three inverters 65, 67 and 69, two resistors 71 and 73 and a capacitor 75, in order to realize a signal at the output terminal 77 having a fixed frequency f. The following frequency arises for a resistance R for the resistors 71 and 73 and a capacitance C for the capacitor 75:

$$f = 0.558/(RC).$$

Figure 7:
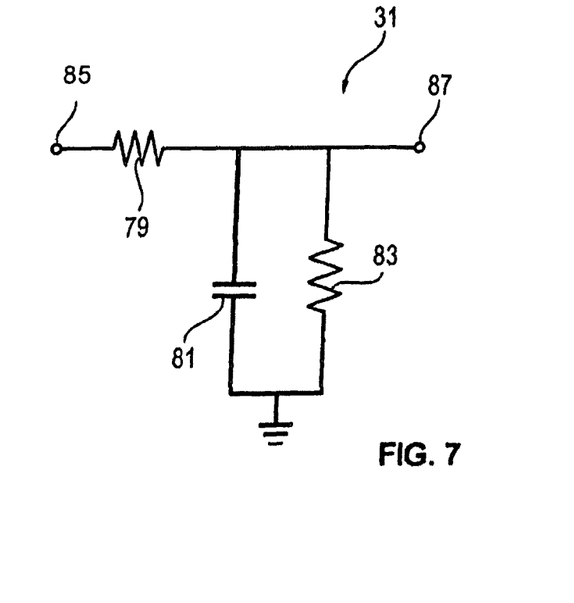
FIG. 7 shows a schematic illustration of an exemplary embodiment of a loop filter.

FIG. 7 reveals an exemplary embodiment of the loop filter 31 illustrated in FIG. 2, said loop filter receiving a clocked output voltage $U_p$ from the amplitude discriminator 29. The loop filter 31 generates, from the digital control signals of the logic unit 45 passing via the shift register 47, an analog voltage for the closed-loop control of the output frequency of the oscillator 7. In the embodiment in accordance with FIG. 7, the loop filter 31 comprises a series resistor 79 and at least one shunt capacitor 81 and also at least one shunt resistor 83, which are situated between the input terminal 85 connected to the shift register 47 and the output terminal 87, connected to the oscillator 7, of the loop filter 31.

In order to increase the output frequency of the oscillator 7, the output 57 of the logic unit 45 is set to "1". This signal charges the shunt capacitor 81 in the loop filter 31 via the series resistor 79 with a time constant $\tau_{charging}$ that corresponds to the product of the resistance of the series resistor 79 and the capacitance of the shunt capacitor 81. The value "0" at the output 57 of the logic unit 45 has the effect that the charge on the shunt capacitor 81 is discharged via the parallel circuit formed by the shunt resistor 83 and the resistor 79. The corresponding time constant $\tau_{discharge}$ corresponds to the product of the capacitance of the shunt capacitor 81 and the resulting resistance of the parallel circuit formed by the two resistors 79 and 83.

Figure 8:
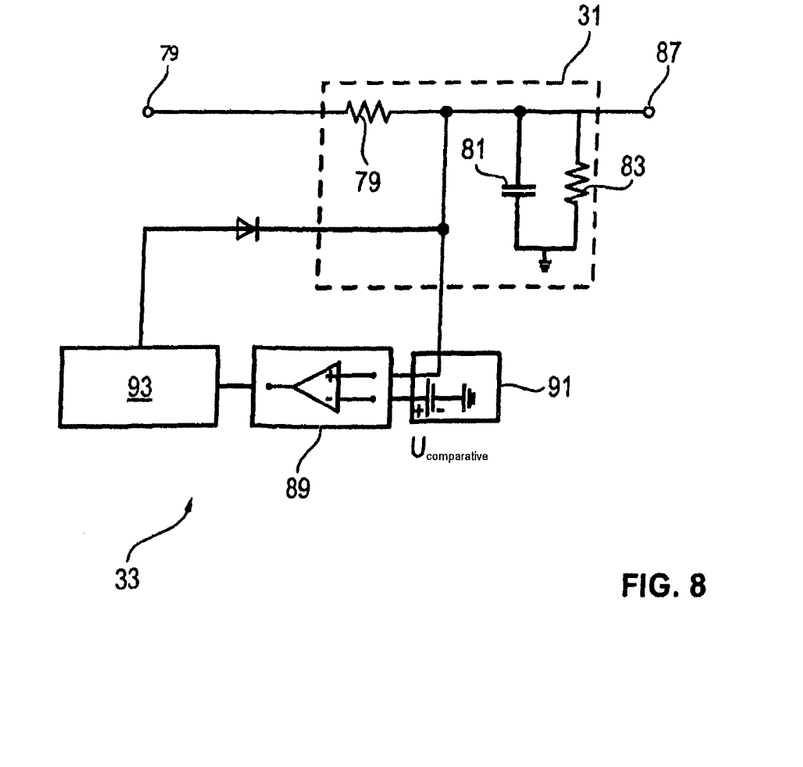
FIG. 8 shows a schematic illustration of an exemplary embodiment of a reset circuit.

FIG. 8 shows a possible embodiment of the reset circuit 33 shown in FIG. 2. In this embodiment, the reset circuit 33 comprises a comparator 89 for comparing the voltage at the shunt capacitor 81 in the loop filter 31 with a reference voltage $U_{comparative}$, wherein the reference voltage $U_{comparative}$ can be generated by means of an external voltage divider 91, for example. The lower limiting frequency of the closed-loop control can thereby be defined. If the voltage at the shunt capacitor 81 in the loop filter 31 falls below the voltage value $U_{comparative}$, a voltage that charges the shunt capacitor 81 in the loop filter 31 is generated via a monostable switch 93. The output frequency of the oscillator 7 can thereby be defined at an upper limiting frequency of the closed-loop control. The reset circuit 33 and the resultant reset process can be activated as necessary both during switch-on and during operation of the RF lamp 5.

To summarize, it can be stated that the RF system 1 shown in FIG. 2 is merely an exemplary embodiment which can be modified with regard to some elements. In particular, the coupling-out devices can be replaced by a circulator. The voltage detection devices 21 and 23 can be suitable detectors of arbitrary design. Furthermore, there is the possibility of integrating the reset circuit 33 shown in FIG. 8 or the function of said reset circuit into the logic unit 45. On the other hand, there is the possibility of replacing the reset circuit 33 by gates, in particular by comparators and/or simple Sample-and-Hold circuits.

The loop filter 31 in accordance with FIG. 7 can, moreover, be replaced by charge pumps, that is to say charge pump circuits based on the model of a phase locked loop circuit (PLL). In this case, the circuit can be designed such that an optimum operating frequency can be "held". In this case, the circuit is somewhat more complex and larger and requires a new logic unit and negative voltages. It is also conceivable to integrate the loop filter 31 or at least the function thereof into the logic unit 45. An analog output voltage is then generated directly in the logic unit 45, such that the use of a clock generator is superfluous. It is also conceivable to extend the logic unit 45. In particular, further conditions can be taken into account, which can realize additional functions without the use of a microprocessor. Additional logic gates are then possibly necessary for this purpose. Moreover, the shift register 47 can also be modified and in particular supplemented, for example by the use of astable flip-flops. In particular, it is possible to provide additional elements which make the clock generator or the clock generator device 49 superfluous.

The use of amplifiers 9 and 12 and of the damping element 11 is also optional. It is also conceivable, for example, to use an amplifier having a variable gain for more exact power setting. Likewise, the damping element can be embodied in a variable fashion or a corresponding additional variable damping element can be provided. In particular, the order of amplification and damping is also optional.

Overall, the present invention realizes an RF system and in particular an advantageous RF signal coupling-in apparatus for use in an RF system for coupling an RF signal into an RF device, in particular into an RF lamp, in a manner as free of losses as possible. The RF signal coupling-in apparatus is preferably of microprocessorless design and, rather, uses logic gates that make a microprocessor superfluous. In this way, the RF system realizes a fast analog closed-loop control of the output frequency of an RF signal coupling-in apparatus e.g. for energy saving lamps. The RF signal coupling apparatus according to the invention enables ignition and efficient operation of an RF lamp at that operating frequency which has the best matching to the RF lamp. The advantageous analog closed-loop control can furthermore compensate for frequency shifts caused by the manufacturing tolerances, the operationally governed thermal behaviour or ageing-dictated changes in the electronics. The logic unit implemented consists of individual logic gates and thus enables an advantageous integration of the circuit into a single semiconductor IC. It thus provides the prerequisites for a cost-effective realization of the RF signal coupling-in apparatus and thus of the entire RF system using mass production.

LIST OF REFERENCE SIGNS

1 RF system
3 RF signal coupling-in apparatus
5 RF device (RF lamp)
7 Oscillator
9 Amplifier
11 Damping element
13 Amplifier
15 Means for generating a voltage signal proportional to the degree of matching of the RF device
17 Coupling-out device
19 Coupling-out device
21 Voltage detection device
23 Voltage detection device
25 Operational amplifier
27 Preferably microprocessorless device
29 Amplitude discriminator
31 Filter device (loop filter)
33 Reset circuit (reset device)
35 Input
37 Comparison device
39 Comparator
41 Voltage value generating device
43 Differentiator unit
45 Logic unit
47 Shift register
49 Clock generator device
51 Input
53 Input
55 Input
57 Output
59 Logic gate
61 Logic gate
63 Inverter
65 Inverter
67 Inverter
69 Inverter
71 Resistor
73 Resistor
75 Capacitor
77 Output terminal
77 Series resistor
81 Shunt capacitor
83 Shunt resistor
85 Input
87 Output
89 Comparator
91 External voltage divider
93 Monostable switch
$f_0$ Operating frequency
$f_0'$ Shifted operating frequency
a Portion of the RF signal of the oscillator
b Portion of the reflected signal
$U_{prop}$ Voltage proportional to the degree of matching of the lamp
$U_D$ Clocked output voltage
$U_A$ Analog output signal

The invention claimed is:

1. An RF system comprising an RF device and an RF signal coupling-in apparatus for operating the RF device, comprising:
   an oscillator for generating an RF signal for operating the RF device comprising
   means for generating a voltage signal proportional to the degree of matching of the RF device on the basis of the RF signal generated by the oscillator and a signal reflected by the RF device, and
   a device for generating a control signal for matching the output frequency of the oscillator on the basis of the voltage signal proportional to the degree of matching of the RF device.

2. The RF system according to claim 1 wherein the means for generating a voltage signal proportional to the degree of matching of the RF device comprise at least one coupling-out device for coupling out a portion of the RF signal generated by the oscillator and for coupling out a portion of the signal reflected by the RF device.

3. The RF system according to claim 2, wherein the means for generating a voltage signal proportional to the degree of matching of the RF device comprise at least one voltage detection device for detecting and outputting a voltage signal of the coupled-out portion of the RF signal generated by the oscillator and at least one further voltage detection device for detecting and outputting a voltage signal of the coupled-out portion of the signal reflected by the RF device.

4. The RF system according to claim 2 wherein the means for generating a voltage signal proportional to the degree of matching of the RF device comprise at least one device, in particular in the form of at least one operational amplifier which generates a voltage signal proportional to the degree of matching of the RF device on the basis of the voltage signal of the coupled-out portion of the signal reflected by the RF device and of the voltage signal of the coupled-out portion of the RF signal generated by the oscillator.

5. The RF system according to claim 2 wherein the means for generating a voltage signal proportional to the degree of matching of the RF device comprise a circulator, which is designed for coupling out a portion of the RF signal generated by the oscillator and for coupling out a portion of the signal reflected by the RF device and, if appropriate, detects and outputs corresponding voltage signals of the coupled-out portions.

6. The RF system according to claim 5 wherein the circulator comprises at least one device, in particular at least one operational amplifier or at least one amplifier circuit, which generates a voltage signal proportional to the degree of matching of the RF device (5) on the basis of the voltage signals of the coupled-out portions.

7. The RF system according to claim 1 wherein device for generating a control signal for matching the output frequency of the oscillator comprises a logic unit having at least one logic gates which outputs a control signal for matching the input frequency of the oscillator on the basis of at least one condition.

8. The RF system according to claim 7 further comprising a shift register for receiving an output signal of the logic unit.

9. The RF system according to claim 8 further comprising a clock generator device for clocking the output signal of the logic unit.

10. The RF system according to claim 7 wherein the logic unit is connected to the oscillator via a loop filter for generating an analog output voltage, for controlling the frequency of said oscillator.

11. The RF system according to claim 7 wherein the logic unit is connected to the oscillator via a charge pump arrangement for generating an analog output voltage, for controlling the frequency of said oscillator.

12. The RF system according to claim 7 wherein the logic unit is designed for generating an analog output voltage for controlling the frequency of the oscillator.

13. The RF system according to claim 1 further comprising a reset circuit for putting the oscillator into a predefined state.

14. The RF System according to claim 1 further comprising a signal coupling-in apparatus.

15. The RF system of claim 1 wherein the the device for generating the control signal is a microprocessorless device.

16. A method for operating an RF device comprising:
   generating an RF signal for operating the RF device by means of an oscillator,
   generating a voltage signal proportional to the degree of matching of the RF device on the basis of the RF signal generated by the oscillator and a signal reflected at the RF device, and
   generating a control signal for matching the output frequency of the oscillator on the basis of the voltage signal proportional to the degree of matching of the RF device.

17. The method according to claim 16, further comprising: generating a first condition on the basis of the voltage signal proportional to the degree of matching of the RF device before generating a control signal for matching the output frequency of the oscillator.

18. The method according to claim 17 wherein the first condition is obtained by comparing the voltage signal proportional to the degree of matching of the RF device with a predefined voltage value.

19. The method according to claim 17 further comprising: generating a second condition on the basis of the voltage signal proportional to the degree of matching of the RF device before generating a control signal for matching the output frequency of the oscillator.

20. The method according to claim 19 wherein the second condition is obtained by deriving the voltage signal proportional to the degree of matching of the RF device.

21. The method according to claim 19 further comprising: leading the first and the second condition and, in particular, a third condition to one or more logic gates and generating a control signal for matching the output frequency of the oscillator on the basis of a truth table based on the logic gate or logic gates.

* * * * *